(12) United States Patent
Chantre et al.

(10) Patent No.: US 10,877,211 B2
(45) Date of Patent: Dec. 29, 2020

(54) METHODS OF FABRICATING INTEGRATED CIRCUIT DEVICES WITH COMPONENTS ON BOTH SIDES OF A SEMICONDUCTOR LAYER

(71) Applicants: STMicroelectronics SA, Montrouge (FR); STMicroelectronics (Crolles 2) SAS, Crolles (FR)

(72) Inventors: Alain Chantre, Seyssins (FR); Sébastien Cremer, Sassenage (FR)

(73) Assignees: STMICROELECTRONICS SA, Montrouge (FR); STMICROELECTRONICS (CROLLES 2) SAS, Crolles (FR)

( * ) Notice: Subject to any disclaimer, the term of this patent is extended or adjusted under 35 U.S.C. 154(b) by 0 days.

(21) Appl. No.: 16/696,086

(22) Filed: Nov. 26, 2019

(65) Prior Publication Data
US 2020/0116927 A1 Apr. 16, 2020

Related U.S. Application Data

(60) Division of application No. 15/699,707, filed on Sep. 8, 2017, now Pat. No. 10,488,587, which is a
(Continued)

(30) Foreign Application Priority Data

Jun. 24, 2013 (FR) ...................................... 1355991

(51) Int. Cl.
*G02B 6/12* (2006.01)
*H01S 5/10* (2006.01)
(Continued)

(52) U.S. Cl.
CPC ..... *G02B 6/12002* (2013.01); *G02B 6/12004* (2013.01); *H01S 5/026* (2013.01);
(Continued)

(58) Field of Classification Search
CPC ............ G02B 6/12002; G02B 6/12004; H01S 5/1032; H01S 5/026; H01S 5/021;
(Continued)

(56) References Cited

U.S. PATENT DOCUMENTS 5,260,567 A * 11/1993 Kuroda ............... G01P 15/0894
250/227.19
5,611,008 A 3/1997 Yap
(Continued)

FOREIGN PATENT DOCUMENTS

WO 2010025222 A1 3/2010

OTHER PUBLICATIONS

Fedeli et al., "Silicon Photonics Developments in Europe," SPIE, PO Box 10 Bellingham WA 98227-0010 USA, 2009, vol. 7220, XP040493293.
(Continued)

*Primary Examiner* — Andrew Jordan
(74) *Attorney, Agent, or Firm* — Slater Matsil, LLP

(57) ABSTRACT

A photonic integrated circuit may include a silicon layer including a waveguide and at least one other photonic component. The photonic integrated circuit may also include a first insulating region arranged above a first side of the silicon layer and encapsulating at least one metallization level, a second insulating region arranged above a second side of the silicon layer and encapsulating at least one gain medium of a laser source optically coupled to the waveguide.

20 Claims, 10 Drawing Sheets

Related U.S. Application Data continuation of application No. 14/311,496, filed on Jun. 23, 2014, now abandoned.

(51) Int. Cl.
   *H01S 5/026* (2006.01)
   *H01S 5/02* (2006.01)
   *H01S 5/042* (2006.01)
   *H01S 5/343* (2006.01)

(52) U.S. Cl.
   CPC ............ *H01S 5/1032* (2013.01); *H01S 5/021* (2013.01); *H01S 5/0262* (2013.01); *H01S 5/0422* (2013.01); *H01S 5/34306* (2013.01); *H01S 2301/176* (2013.01)

(58) Field of Classification Search
   CPC .. H01S 5/0262; H01S 5/0422; H01S 5/34306; H01S 2301/176
   See application file for complete search history.

(56) References Cited

U.S. PATENT DOCUMENTS

| | | | |
|---|---|---|---|
| 5,659,565 A * | 8/1997 | Kitamura | B82Y 20/00 372/43.01 |
| 5,953,362 A | 9/1999 | Pamulapati et al. | |
| 5,991,322 A * | 11/1999 | Takiguchi | B82Y 20/00 372/45.012 |
| 6,670,599 B2 | 12/2003 | Wagner et al. | |
| 6,791,181 B2 | 9/2004 | Horie et al. | |
| 6,797,987 B2 | 9/2004 | Chen | |
| 7,023,886 B2 | 4/2006 | Deacon | |
| 7,257,283 B1 | 8/2007 | Liu et al. | |
| 7,433,374 B2 * | 10/2008 | Govorkov | H01S 5/026 372/21 |
| 8,110,823 B2 | 2/2012 | Bowers | |
| 8,257,990 B2 | 9/2012 | Koch | |
| 8,451,707 B1 | 5/2013 | Stipe | |
| 8,604,577 B2 | 12/2013 | Koch | |
| 8,787,417 B2 | 7/2014 | Baets et al. | |
| 8,890,286 B2 | 11/2014 | O'Donnell et al. | |
| 8,937,296 B2 | 1/2015 | Bowers | |
| 9,054,489 B2 * | 6/2015 | Kim | H01S 5/1206 |
| 9,097,848 B2 | 8/2015 | Bowers | |
| 9,136,672 B2 | 9/2015 | Luo et al. | |
| 9,209,142 B1 | 12/2015 | Lambert et al. | |
| 9,507,089 B2 * | 11/2016 | Chantre | H01S 5/026 |
| 9,972,968 B2 | 5/2018 | Zhang et al. | |
| 10,002,996 B2 | 6/2018 | Nagano | |
| 10,126,497 B2 * | 11/2018 | Boeuf | G02B 6/126 |
| 10,488,587 B2 * | 11/2019 | Chantre | G02B 6/12004 |
| 10,656,331 B2 * | 5/2020 | Boeuf | G02B 6/30 |
| 2001/0036727 A1 * | 11/2001 | Sandhu | H01L 21/32051 438/656 |
| 2002/0063329 A1 | 5/2002 | Horie et al. | |
| 2003/0008491 A1 * | 1/2003 | Sandhu | H01L 21/32051 438/622 |
| 2003/0015768 A1 | 1/2003 | Bosco | |
| 2003/0086655 A1 | 5/2003 | Deacon | |
| 2003/0138997 A1 * | 7/2003 | Wang | H01L 21/76256 438/151 |
| 2003/0164503 A1 | 9/2003 | Chen | |
| 2003/0170466 A1 * | 9/2003 | Stachowiak | C03C 17/36 428/432 |
| 2004/0012331 A1 * | 1/2004 | Yamazaki | H01L 51/529 313/506 |
| 2004/0089863 A1 * | 5/2004 | Wang | H01L 29/78603 257/66 |
| 2004/0092104 A1 * | 5/2004 | Gunn, III | H01L 21/823878 438/689 |
| 2004/0169259 A1 * | 9/2004 | Zheng | H01L 21/0217 257/649 |
| 2007/0013020 A1 | 1/2007 | Blauvelt et al. | |
| 2007/0014325 A1 | 1/2007 | Park et al. | |
| 2007/0170417 A1 | 7/2007 | Bowers | |
| 2007/0258498 A1 | 11/2007 | Kawahara et al. | |
| 2009/0154517 A1 | 6/2009 | Leem et al. | |
| 2009/0245298 A1 | 10/2009 | Sysak et al. | |
| 2009/0323746 A1 | 12/2009 | Ohmi et al. | |
| 2010/0092144 A1 | 4/2010 | Blauvelt et al. | |
| 2010/0328807 A1 | 12/2010 | Snyder et al. | |
| 2011/0091219 A1 | 4/2011 | Tatum et al. | |
| 2011/0158278 A1 | 6/2011 | Koch | |
| 2012/0008658 A1 | 1/2012 | Chung | |
| 2012/0320939 A1 | 12/2012 | Baets et al. | |
| 2013/0022072 A1 | 1/2013 | Bowers | |
| 2013/0044780 A1 | 2/2013 | Inao et al. | |
| 2013/0208752 A1 | 8/2013 | Koch | |
| 2014/0098833 A1 * | 4/2014 | Kim | H01S 5/105 372/44.011 |
| 2014/0376857 A1 | 12/2014 | Chantre et al. | |
| 2015/0055911 A1 | 2/2015 | Bowers | |
| 2015/0378187 A1 | 12/2015 | Heck et al. | |
| 2016/0047986 A1 * | 2/2016 | Chantre | G02B 6/12004 385/14 |
| 2016/0053968 A1 | 2/2016 | Nagano | |
| 2017/0054039 A1 | 2/2017 | Gong et al. | |
| 2017/0207600 A1 * | 7/2017 | Klamkin | G02B 6/12002 |
| 2017/0336560 A1 * | 11/2017 | Boeuf | G02B 6/12004 |
| 2017/0371099 A1 | 12/2017 | Chantre et al. | |
| 2020/0116927 A1 * | 4/2020 | Chantre | G02B 6/12004 |

OTHER PUBLICATIONS

Fedeli et al., "Integration issues of a photonic layer on top of a CMOS circuit," SPIE, PO Box 10 Bellingham WA 98227-0010, USA, 2006, vol. 6125, XP040219647.

Liang et al., "100 mm Integration of 111-V and Silicon-on-Insulator Wafers for the Realization of Distributed Feedback Silicon Evanescent Lasers," SPIE, PO Box 10 Bellingham WA 98227-0010 USA, 2008, vol. 7135, XP040444774.

* cited by examiner

METHODS OF FABRICATING INTEGRATED CIRCUIT DEVICES WITH COMPONENTS ON BOTH SIDES OF A SEMICONDUCTOR LAYER

CROSS-REFERENCE TO RELATED APPLICATIONS

This application is a divisional application of Ser. No. 15/699,707, filed Sep. 8, 2017, which is a continuation application of U.S. patent application Ser. No. 14/311,496, filed Jun. 23, 2014, which claims priority to France Patent Application No. 1355991, filed Jun. 24, 2013, which applications are incorporated herein by reference.

TECHNICAL FIELD

The present invention relates to integrated circuit devices, and more particularly to methods of fabricating integrated circuit devices with components on both sides of a semiconductor layer and the devices formed thereby.

BACKGROUND

Currently, photonic integrated circuits allow the integration of practically all active or passive optical devices, such as, for example, coupling structures, waveguides, modulators, or photodetectors.

Moreover, another known advantageous component is a hybrid III-V/Si laser source. Such a laser source includes an amplifying medium (gain medium) that includes a composite III-V semiconductor material, a waveguide situated in an underlying silicon layer and optically coupled to the gain medium, and a cavity resonator optically coupled to the waveguide and containing Bragg mirrors, for example. The gain medium emits light when it is excited by electrical energy (pumping), and the cavity resonator is intended, in cooperation with the gain medium, to amplify this light so as to deliver the laser beam.

Depending on the type of laser (DBR: Distributed Bragg Reflector or DFB: Distributed Feedback laser), the Bragg mirrors are situated in the silicon at the periphery of the gain medium or else under the gain medium.

Such a hybrid laser source may require a very short distance, typically not more than a hundred nanometers, between the gain medium and the underlying silicon waveguide. Moreover, direct bonding of the gain medium to a waveguide of silicon-on-insulator type typically requires a planar surface prepared by a chemical-mechanical polishing step. Currently, a hybrid III-V laser source on a silicon substrate can be manufactured on an experimental basis and in isolation.

Integrated photonic circuits generally do not incorporate hybrid III-V/Si laser sources due to the great difficulty of integrating these sources. This is because direct bonding to the silicon-on-insulator film cannot be carried out after the complete production of the integrated circuit, and particularly after the production of the metallization levels of the interconnect part of the integrated circuit, widely denoted as the Back End Of Line (BEOL) part by those skilled in the art.

Furthermore, conventional production of the metallization levels (using deposition and chemical-mechanical polishing (CMP) of dielectrics/metals) cannot be carried out after any steps of integration of the laser source due to the substantial height of the laser source, typically about 3 microns. As a result hybrid III-V laser sources may therefore be incompatible with integration into integrated circuits. Therefore, the approach currently used to associate a laser source with an integrated circuit includes, after the integrated circuit and its interconnect (BEOL) part have been produced, fixing an already assembled laser source to one of the sides of the chip.

SUMMARY

According to one aspect, a photonic integrated circuit that effectively integrates a hybrid laser source while being compatible with the conventional steps of fabrication of an integrated circuit, particularly the fabrication of the metallization levels, is provided. In particular, it may be possible to achieve such integration by carrying out a treatment of the back-side of the semiconductor wafer, leading to back-side integration of the laser source, whereas the metallization levels (BEOL part of the integrated circuit) are arranged on the front side.

According to one aspect, a photonic integrated circuit may include a silicon layer that includes a waveguide and at least one other electronic component, for example, an optical coupler, a modulator, or a photodetector. The photonic integrated circuit may also include a first insulating region arranged above a first side, for example the front side, of the silicon layer and encapsulating at least one metallization level, and typically several metallization levels. A second insulating region may be arranged above a second side, for example the back side, of the silicon layer and encapsulating at least the gain medium of a laser source optically coupled to the waveguide.

The cavity resonator of the laser source may include Bragg mirrors, for example. When the silicon layer is thick enough, the cavity resonator, typically the Bragg mirrors, and the waveguide may be produced inside the silicon layer. However, in some applications, it may be preferable for the silicon layer not to be too thick, i.e. typically less than or equal to 300 nanometers in thickness, so as not to compromise the operational efficiency of the other photonic components. Furthermore, in such a configuration, either the laser is a DBR laser and an additional waveguide is then advantageously arranged above the second side of the silicon layer, and the second insulating region then also encapsulates this additional waveguide, or the laser is a DFB laser and an additional waveguide as well as the Bragg mirrors of the cavity resonator are then advantageously arranged above the second side of the silicon layer, and the second insulating region then also encapsulates this additional waveguide, as well as the Bragg mirrors.

The gain medium of the laser source is then advantageously situated in the immediate vicinity of this additional means or additional waveguide and possible cavity resonator, for example separated from this additional means by part of the second insulating region having a thickness less than or equal to 100 nanometers.

As a variant, the additional means, or additional waveguide and possible cavity resonator, can be arranged not above the second side of the silicon layer, but above the first side of this silicon layer. The first insulating region then also encapsulates the additional means. The gain medium of the laser source is then situated in the immediate vicinity of the second side of the silicon layer, for example separated from this second side by an insulating layer, commonly denoted PADOX by those skilled in the art, possibly having a thickness about one hundred nanometers.

The silicon layer may also incorporate a coupler, and the first insulating region may incorporate a metal mirror arranged facing the coupler. The coupler will then, for example, send part of the laser beam emitted by the laser source back across the second insulating region and another part in the direction of the metal mirror, which will reflect it towards the second insulating region. In this way interference with the various insulating layers, in particular the nitride layers of the first insulating region is reduced, and losses in the substrate, which conventionally occur for a coupler produced on an silicon-on-insulator (SOI) substrate, are also reduced.

This feature, i.e. a metal mirror incorporated into the first insulating region and arranged facing a coupler, can be considered independently of the presence of a laser source integrated into the integrated circuit as defined above. The metal mirror is advantageously arranged in a first metallization level situated opposite the first side of the silicon layer. The coupler, incorporated into the silicon layer, can be a grating coupler possessing a relief surface turned towards the first insulating region.

According to another aspect, a method of fabrication of a photonic integrated circuit is provided. The method includes producing, inside a silicon layer arranged above a buried insulating layer arranged above a carrier substrate, a waveguide and at least one other photonic component. The method also includes producing, above a first side of the silicon layer, at least one metallization level encapsulated in a first insulating region, and removing the carrier substrate and the buried insulating layer so as to uncover or approach a second side of the silicon layer, opposite the first side.

The method also includes making a laser source optically coupled to the waveguide. Making the laser source includes encapsulating at least the gain medium of this laser source in a second insulating region situated above the second side.

According to one embodiment, the production of the laser source includes forming an etched heterostructure above at least one additional insulating layer itself situated above the second side. The etched heterostructure may form the gain medium. Another insulating layer may be deposited above the at least one additional insulating layer and the heterostructure so as to form the second insulating layer.

According to a first variant, the production of the laser source may include, prior to the formation of the gain medium, forming, above the second side of the silicon layer, an additional means or at least one additional waveguide optically coupled to the waveguide. According to one embodiment of this variant, the formation of the additional means may include depositing an additional silicon layer above the additional insulating layer, at least one etching of the additional silicon layer, and depositing at least one additional insulating layer above the etched additional silicon layer and the additional insulating layer. The heterostructure may be formed above the at least one additional insulating layer.

According to another variant, the method may include prior to production of the metallization level or levels, forming, above the first side of the silicon layer, an additional means or at least one additional waveguide optically coupled to the waveguide. According to one embodiment, which can be considered independently of the production of the laser layer, the method may furthermore include producing, in the silicon layer, a coupler and producing a metal mirror encapsulated in the first insulating region facing the coupler. The mirror may advantageously be produced during the production of the tracks of a first metallization level.

DETAILED DESCRIPTION OF ILLUSTRATIVE EMBODIMENTS

Figure 1:
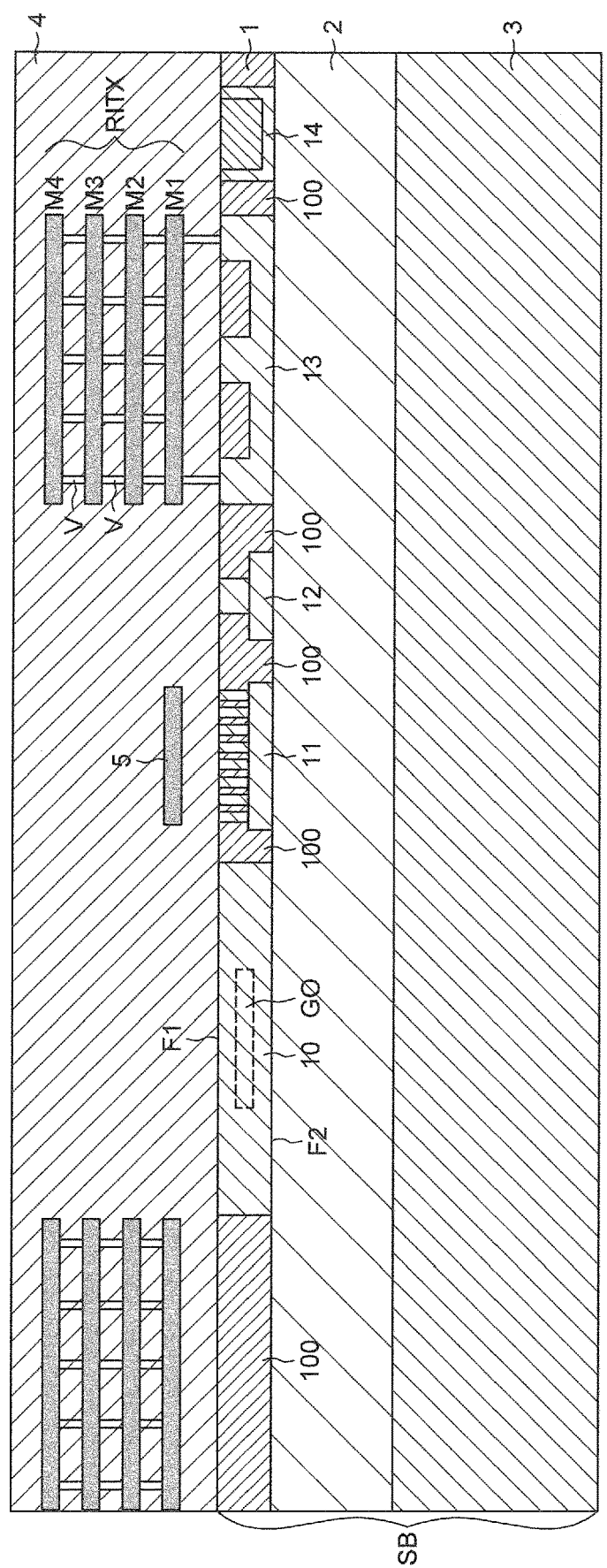
FIG. 1 is a schematic cross-sectional view of a photonic integrated structure preparatory to obtaining of a photonic integrated circuit in accordance with an embodiment of the present invention.

In FIG. 1, the reference SB denotes a Silicon-On-Insulator (SOI) wafer. The SOI substrate includes a semiconductor layer or film, and more particularly, a silicon layer or film 1 having, in this embodiment, a thickness of about 300 nanometers, arranged above a buried insulating layer 2, commonly denoted BOX (Buried Oxide) by those skilled in the art. This buried insulating layer 2 is itself arranged above a carrier substrate 3.

Various photonic components are produced in this silicon layer 1, for example, a waveguide GO arranged in a part 10 of this layer, a grating coupler 11, another waveguide 12, a modulator 13 and a photodetector 14.

Although any kind of optical modulator may be used, the modulator 13 may be an electro-optical modulator, for example a Mach-Zehnder modulator having an architecture well known by the man skilled in the art and including a phase shifter (also called phase modulator) in each of the two branches of the Mach-Zehnder modulator, both phase shifters being controlled in phase opposition. For simplicity reasons only one of those phase shifters of the modulator 13 is illustrated in the figures.

Of course, FIG. 1 shows a variety of photonic components that can be produced in the silicon layer without this list being exhaustive. Of course, it may be possible for only some of these components to be produced, depending on the desired applications. These various photonic components are mutually separated by an insulating region 100, silicon dioxide for example.

It should be noted that if the laser source to be produced is a DBR laser, the part 10 of the silicon layer also incorporates Bragg mirrors optically coupled to the waveguide GO and which are to be situated on the periphery of the III-V gain medium of the laser source.

This silicon layer 1 has a first side F1, or front side, and a second side F2 or back side, that is arranged above the buried insulating layer 2. In a conventional way known per se, the process for producing each photonic integrated circuit of the wafer includes producing several metallization levels, here four levels M1, M2, M3, M4 embedded in a first insulating region 4. The insulating material forming this first insulating region is commonly denoted as the intermetal dielectric (IMD) by those skilled in the art. This production may be conventionally based on deposition and chemical-mechanical polishing (CMP) of dielectrics (oxide) and metals (copper).

The tracks produced in these metallization layers can, at least in some cases, be connected by vias V. These metallization levels are typically used to interconnect components and to connect them to external contact pads. The height of the interconnect region RITX is typically about 3 microns.

Figure 2:
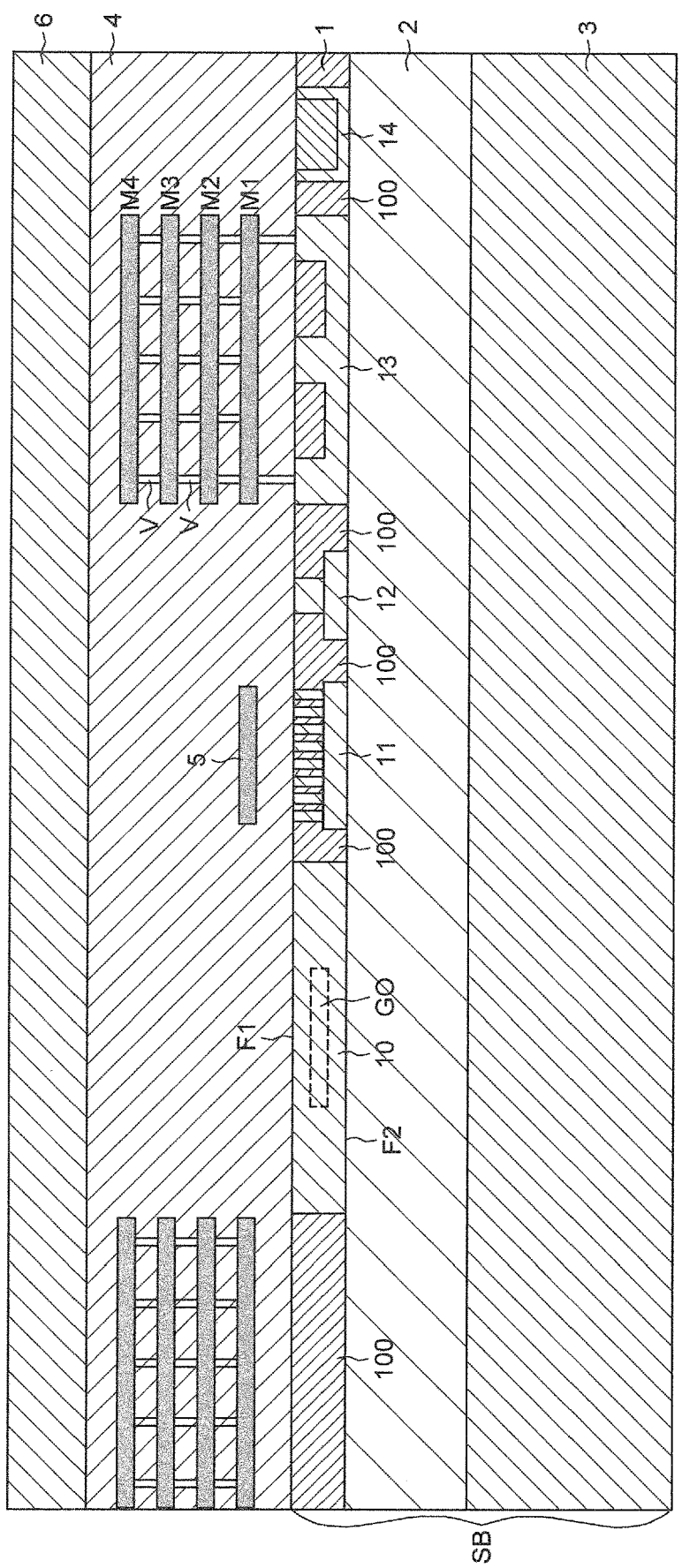
FIG. 2 is a schematic cross-sectional view of the photonic integrated structure of FIG. 1 after bonding of a handle substrate.

Simultaneously with the production of the tracks of the first metallization level M1, a metal mirror 5 may be advantageously produced opposite the relief surface of the grating coupler 11. Next, a substrate 6 acting as a handle is bonded (FIG. 2) to the upper side of the insulating region 4.

Figure 3:
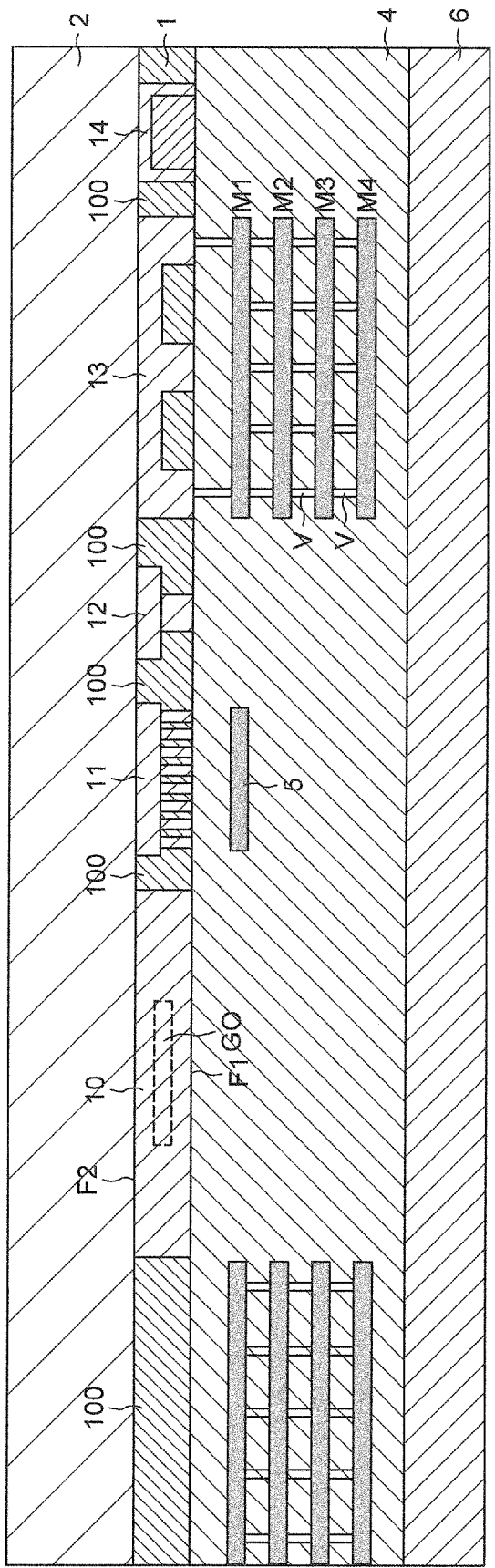
FIG. 3 is a schematic cross-sectional view of the photonic integrated structure of FIG. 2 after removal of the carrier substrate of said structure.
Figure 4:
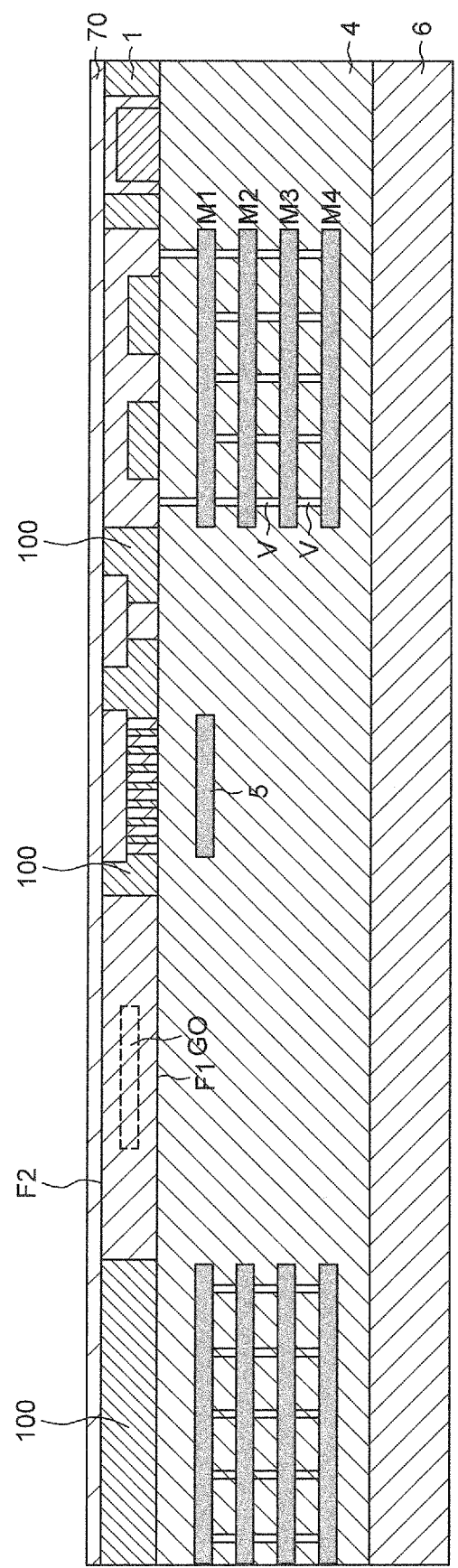
FIG. 4 is a schematic cross-sectional view of the photonic integrated structure of FIG. 3 after etching of the insulating layer.

After the structure has been flipped, the carrier substrate 3 is removed, as illustrated in FIG. 3, typically by grinding. As illustrated in FIG. 4, the insulating (BOX) layer 2 is etched to uncover the second side F2 of the silicon layer, i.e. the back side. It is from this back side that the processing for producing the laser source will be carried out.

This being so, generally, no processing is carried out on bare silicon. This is the reason why, before carrying out further processing, the silicon layer is covered with an additional insulating layer 70, commonly denoted the PADOX by those skilled in the art.

As a variant, when the buried insulating layer 2 includes a stack that includes a PADOX layer topped by a silicon layer nitride topped by a layer of TEOS oxide, the etching of the layer 2 is carried out as far as the PADOX layer 70, which may make it possible to avoid consuming the silicon dioxide of the regions 100. In this case, the side F2 of the silicon layer is approached and thus it may not be desirable to reform the PADOX layer 70. The thickness of this PADOX layer is typically about too nanometers.

Figure 5:
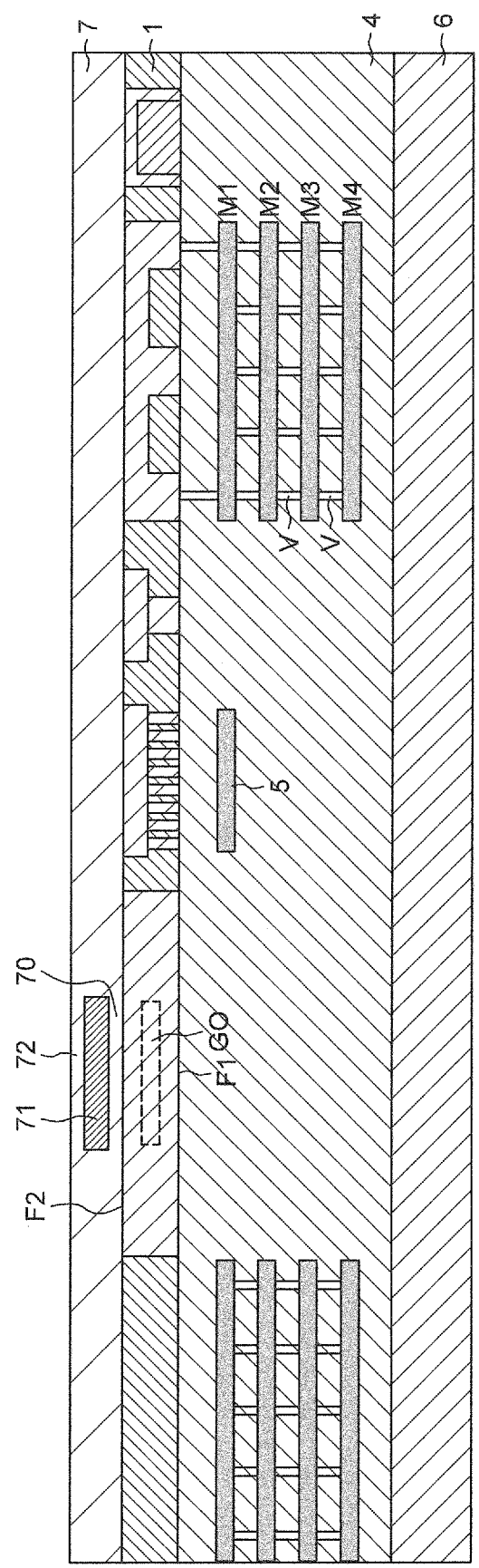
FIG. 5 is a schematic cross-sectional view of the photonic integrated structure of FIG. 4 including an additional waveguide above the waveguide.

Next, as illustrated in FIG. 5, an additional waveguide 71 is produced above the waveguide GO of the interconnect part 10. This waveguide 71 may be for the future laser source that is here assumed to be a DFB laser.

In this respect, wafer-scale deposition of an amorphous silicon layer is carried out on the additional insulating layer 70, which layer is etched so as to form the additional waveguide 71. In the event of the future laser source being a DFB laser, the additional means 71 or additional waveguide also incorporate Bragg mirrors optically coupled to the additional waveguide to contribute to the formation of the cavity resonator. In this respect, a double etching of the amorphous silicon layer is carried out to form the additional waveguide, then the Bragg mirrors.

Next, an additional insulating layer 72, for example made of silicon dioxide, is deposited on the additional means 71 and on the additional insulating layer 70 (PADOX), and a chemical-mechanical polishing is then carried out on the additional insulating layer 72. The thickness of the additional means 71 is typically about 200 nanometers, whereas the thickness of the additional insulating layer 72 is less than or equal to 100 nanometers.

Figure 6:
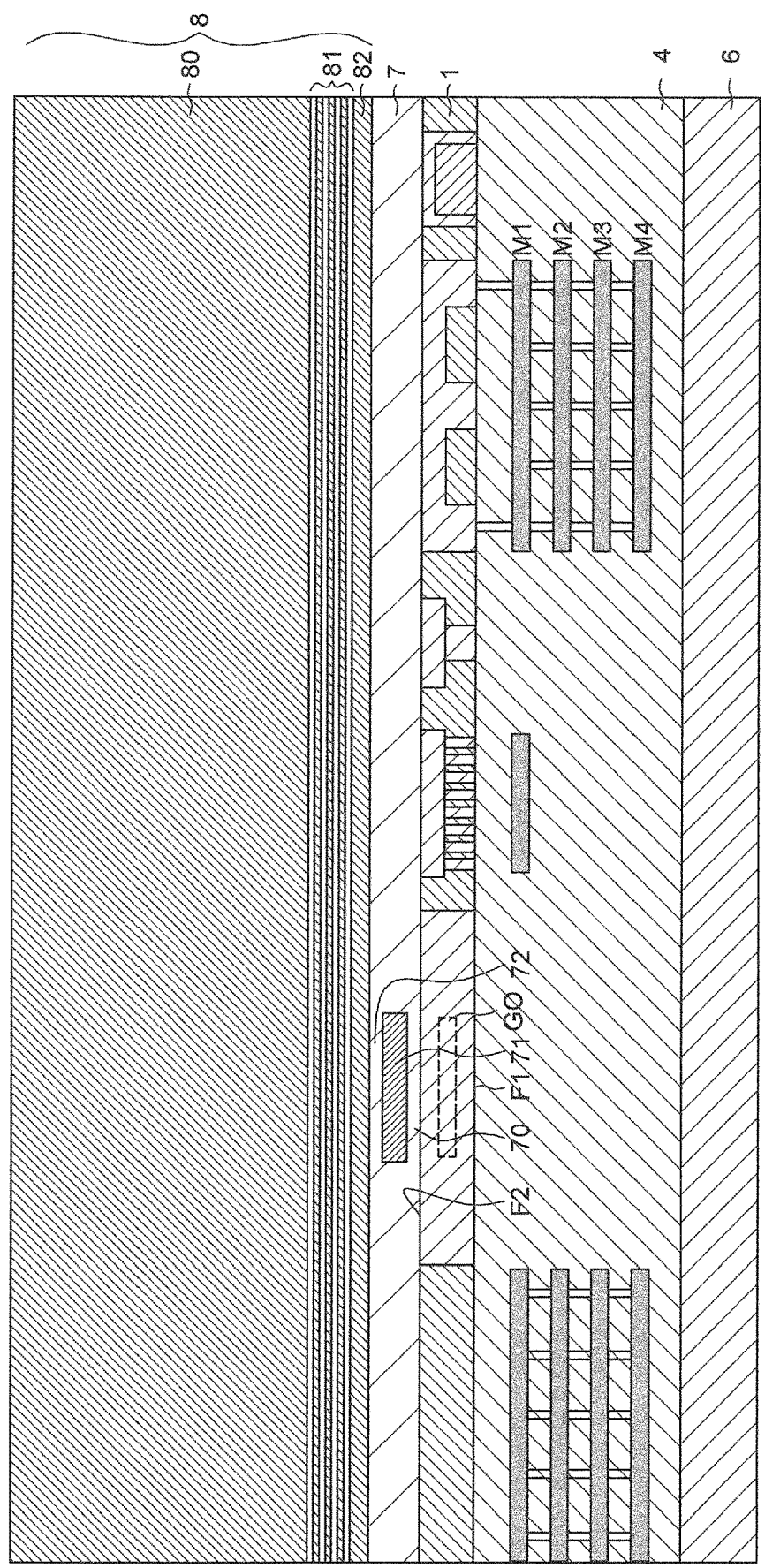
FIG. 6 is a schematic cross-sectional view of the photonic integrated structure of FIG. 5 after III-V wafer bonding.

The stack 7 thus produced and having been polished, is thus ready to receive the active gain medium that amplifies the laser source. Thus, as illustrated in FIG. 6, a heterostructure 8 made of III-V semiconductor material is formed. This formation is carried out by direct bonding of a wafer 8 formed by a III-V heterostructure.

More precisely, the heterostructure 8 includes a substrate 80 that includes a p-type semiconductor material, InP for example, a stack 81 of layers forming quantum wells, made of InGaAsP for example, and a layer 82 of an n-type material, for example an InP/InGaAs stack.

The thickness of the heterostructure 8 may typically be about a few hundred microns. The thickness of the stack of quantum wells 81 may be about 300 nm and the thickness of the layer 82 may be about 200 nm.

Figure 7:
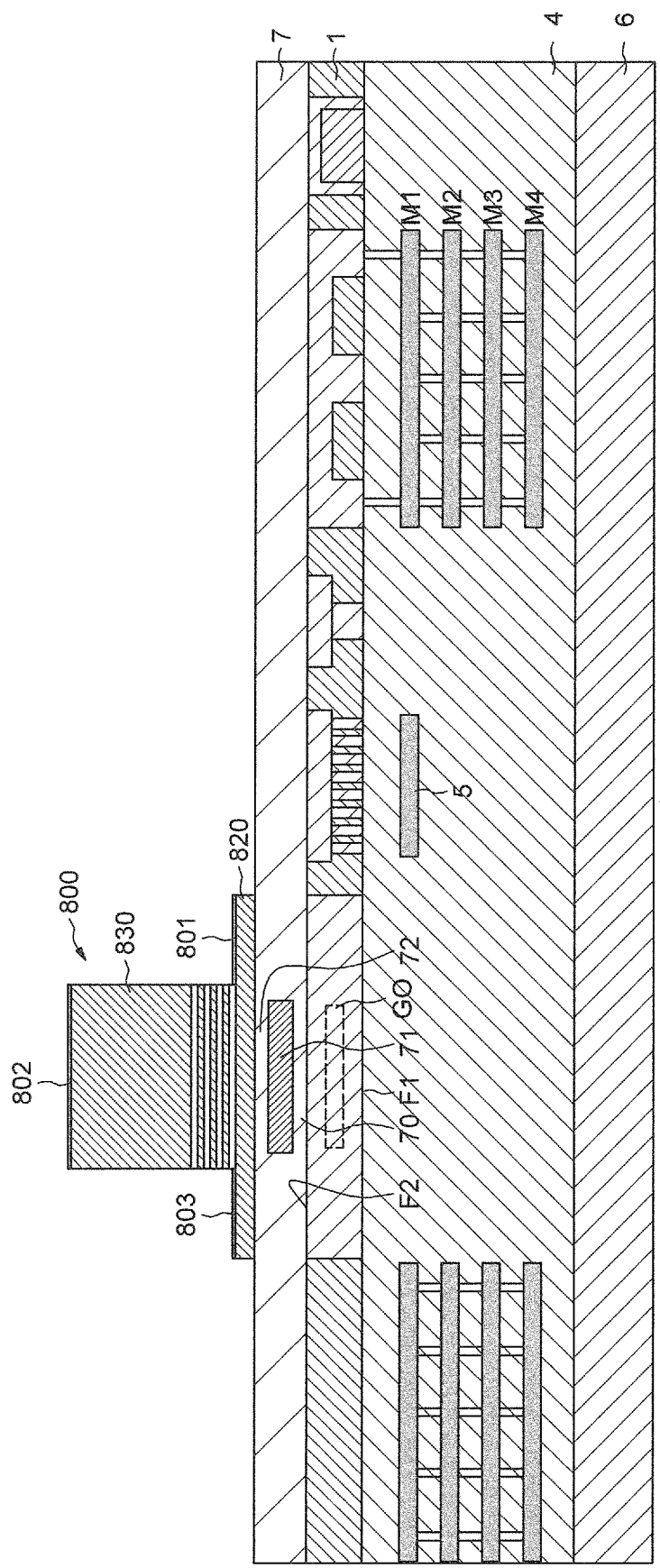
FIG. 7 is a schematic cross-sectional view of the photonic integrated structure of FIG. 6 after selective chemical etching of the substrate of the wafer and III-V laser patterning and etching.

As illustrated in FIG. 7, selective chemical etching of the substrate 80 (selective over the active layers 81 and 82) is carried out, followed by lithography and etching adapted to the III-V material to obtain the gain medium 800 of the laser source. Next eutectic deposits 801, 802, 803, based on gold for example, are deposited to allow metal contacts to be made to the etched layer 820 and to the etched layer 830.

Figure 8:
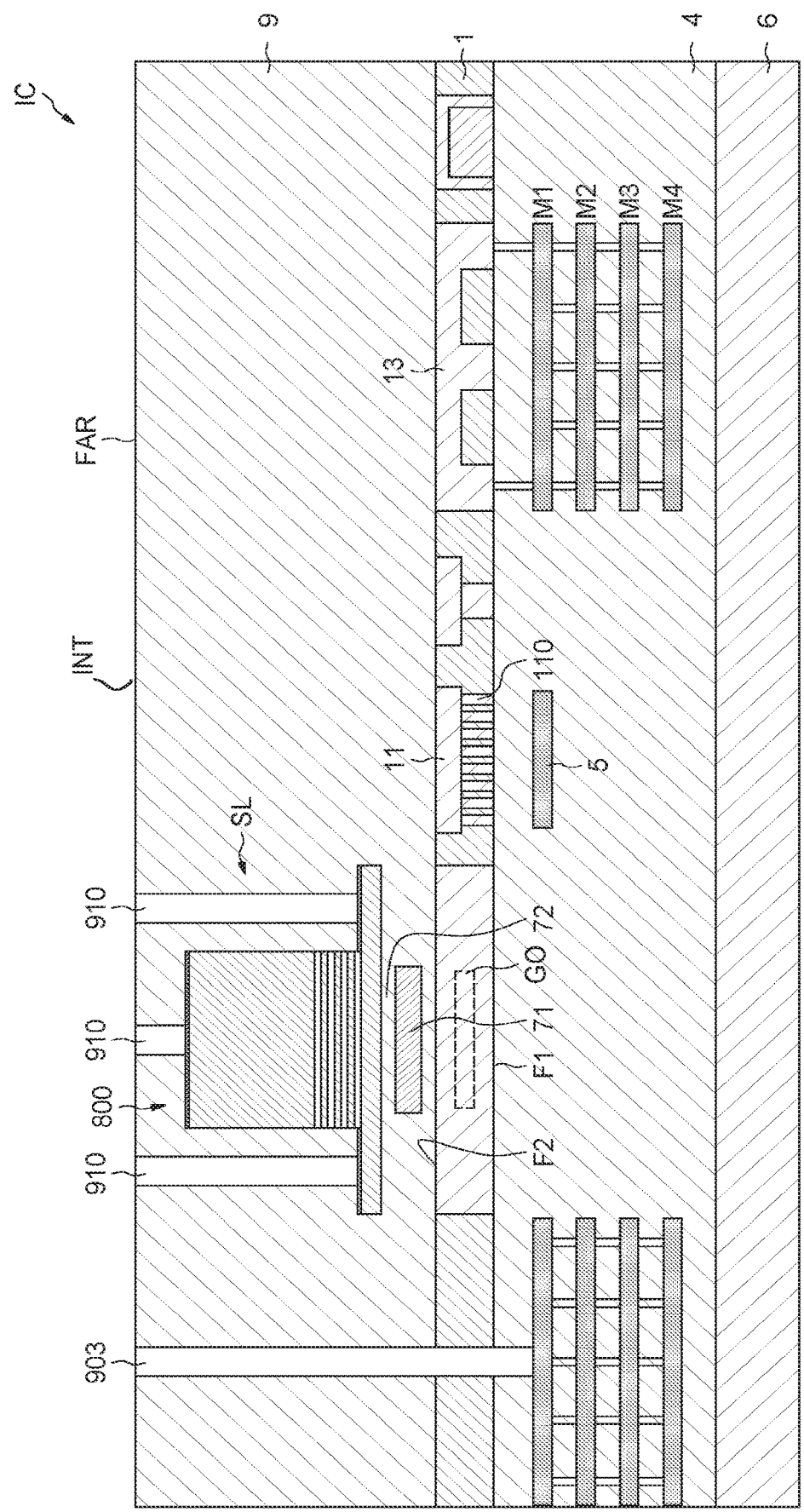
FIG. 8 is a schematic cross-sectional view of a photonic integrated circuit in accordance with an embodiment of the present invention.

As illustrated in FIG. 8, the structure is encapsulated by depositing another insulating layer above the stack 7 to form a second insulating region 9 above the structure 800 and the stack 7. Conventional production of contacts 910 is carried out to make contact with the eutectic zones 801, 802 and 803, as well as conventional production of other contacts 903 to connect metal tracks to contact pads situated on the back side.

After the steps of finishing and cutting the wafer to singulate the integrated circuits, a photonic integrated circuit IC is obtained, as illustrated in FIG. 8. The integrated circuit includes a silicon layer 1 that includes a waveguide GO and at least one other photonic component and a first insulating region 4 arranged above a first side F1 of the silicon layer and encapsulating here several metallization levels M1-M4. The integrated circuit also includes a second insulating region 9 above a second side F2 of the silicon layer and encapsulating the gain medium 8oo of the laser source SL and, in this embodiment, an additional means 71 or at least one additional waveguide, and possibly also Bragg mirrors. This laser source is optically coupled to the waveguide GO which is situated in part 10 of the silicon layer 1.

Figure 9:
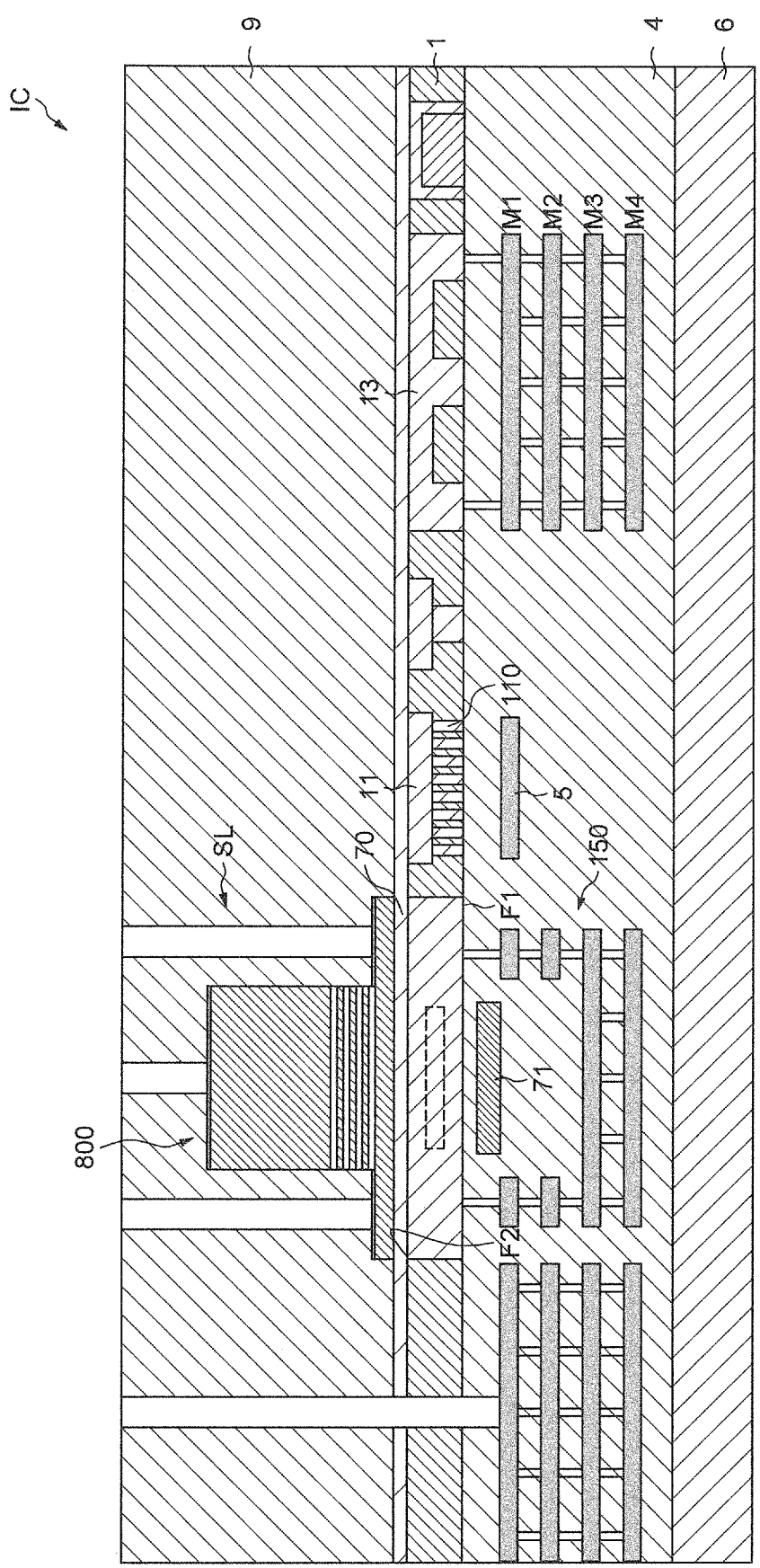
FIG. 9 is a schematic cross-sectional view of a photonic integrated circuit in accordance with another embodiment of the present invention.

As a variant, as illustrated in FIG. 9, it may be possible to arrange the additional means 71 of the laser source in the first insulating region 4. The gain medium 800 of the laser source SL is then arranged in the immediate vicinity of the silicon layer 1 and is separated from the second side F2 of the latter by the additional insulating layer 70 (PADOX). In this respect, the additional means 71 are produced prior to the production of the metallization levels M1-M4 of the integrated circuit, again by wafer-scale deposition of a layer of amorphous silicon and etching(s).

It should also be noted that, whether in the embodiment of FIG. 8 or the embodiment of FIG. 9, the grating coupler 11 turns its relief surface 110 towards the first insulating region 4 in the direction of the metal mirror 5. The light beam that arrives on the coupler via the silicon layer is subdivided in the coupler 11 into a first beam that crosses the insulating region 9 towards an optical fiber fixed onto the back side FAR of the chip via an optical interface INT for example, and into a second beam that travels towards the metal mirror 5 to be reflected in the direction of the optical fiber. Thus, none of these beams may be perturbed by the nitride layers that are, for example, found in the first insulating region 4. The production of a metal mirror 5 in the first insulating region 4 is generally independent of the integration (or absence of integration) of a hybrid III-V laser source in the IC chip.

Thus, according to another aspect, a photonic integrated circuit is provided that includes a silicon layer that includes at least one coupler 11, for example a grating coupler, and a first insulating region 4 arranged above a first side F1 of the silicon layer 1 and encapsulating one or more metallization levels. A metal mirror is situated facing the coupler, for example a first metallization layer, and a second insulating layer 9 is situated above a second side F2 of the silicon layer 1, opposite the first side.

The advantages of such a structure in relation to a prior-art structure, as illustrated in FIG. to, are now described. In the prior-art structure equipped, for example, with an optical fiber fixed to its front side FAV, when a light beam reaches the coupler 11, it is subdivided into a first beam that crosses the insulating region 4 towards the optical fiber, and into a second beam that moves towards the substrate 3. Thus, there is a loss in the substrate and a perturbation of the first beam by the nitride layers of the first insulating region.

Thus, according to this other aspect, losses in the substrate and perturbations by the nitride layers as indicated above, are reduced or avoided. It may also be possible, as illustrated in FIG. 9, to incorporate, into the first insulating region 4, a means 150 or a heat-dissipating radiator connected to the silicon layer 1, opposite the gain medium of the laser source. This means or heat-dissipating radiator may be produced by metal tracks and specific vias simultaneously with the production of the metal tracks of the various metallization levels of the interconnect (BEOL) part of the integrated circuit.

Of course this heat-dissipating radiator can also be provided in the embodiment in FIG. 8. Also, the heat-dissipating radiator may improve the heat dissipation of the integrated circuit.

As indicated above and illustrated in particular in FIG. 8 or 9, the photonic integrated circuit includes as a photonic component, a modulator 13. As indicated above, although any kind of optical modulator may be used, the modulator illustrated is, for example, a Mach-Zehnder modulator having a structure well-known by the man skilled in the art. Only one phase shifter of the Mach-Zehnder modulator is represented for ease of understanding.

Figure 10:
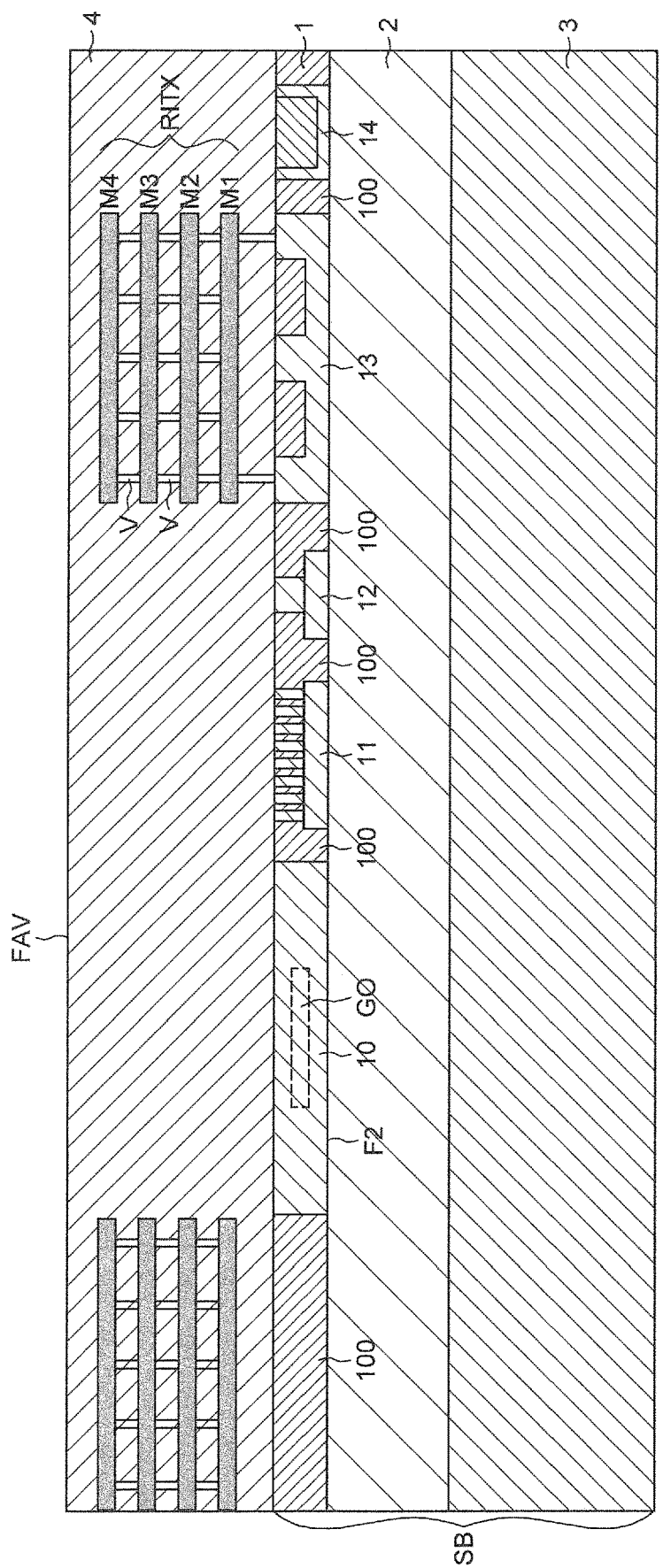
FIG. 10 is a schematic cross-sectional view of an integrated circuit in accordance with the prior art.

In integrated circuits of the prior art, such as the one illustrated in FIG. 10, having an SOI substrate including the silicon layer or film 1 arranged above the buried insulating layer (BOX) 2 itself arranged above the carrier substrate 3, the modulator 13 is above the carrier substrate. However such a prior structure has drawbacks.

As a matter of fact if the carrier substrate is a small resistivity (SR) substrate, some resistive and capacitive (RC) parasitic effects occur between the silicon film and the carrier substrate leading to a speed limitation and an increase of power consumption.

It may be possible to avoid such drawbacks by using a high resistivity (HR) substrate as the carrier substrate. However using such HR-SOI substrates may be relative costly and may lead to processing issues.

The fabrication method described above leads, with reference to FIGS. 1-9, to a photonic integrated circuit that includes a modulator 13 having, as illustrated in FIG. 8 or 9, without a carrier substrate above the modulator after the structure has been flipped and the carrier substrate 3 removed, as illustrated in FIG. 3, typically by grinding.

Thus RC parasitic effects are greatly reduced while HR-SOI substrates are no longer needed. For example, a parasitic capacitor reduction of 50% may be obtained versus a prior art structure based on an SR-SOI substrate, and a parasitic capacitor reduction of 33% may be obtained versus a prior art structure based on an HR-SOI substrate.

Thus according to another embodiment illustrated in FIG. 8 or 9, a photonic integrated circuit is also proposed, that includes a silicon layer 1 that includes a modulator 13 having a relief surface and another surface opposite the relief surface, a first insulating region 4 arranged above a first side F1 of the silicon layer and encapsulating at least one metallization level M1-M4 coupled to the relief surface of the modulator, a second insulating region 9 arranged above a second side F2 of the silicon layer and above the another surface of the modulator, and no other substrate turned towards the another surface of the modulator.

As illustrated also in FIG. 8 or 9, a photonic integrated circuit is also proposed that includes a substrate (for example the handle substrate 6), a silicon layer 1 including a modulator 13 having a relief surface turned towards the substrate and another surface opposite said relief surface, a first insulating region 4 arranged between a first side F1 of the silicon layer and the substrate and encapsulating at least one metallization level M1-M4 coupled to the relief surface of the modulator, and a second insulating region 9 arranged above a second side F2 of the silicon layer and above the another surface of the modulator.

Further at least one metallization level M1-M4 may be advantageously used for forming a shield for shielding the modulator from said handle substrate. Of course the integrated circuit may include such a modulator with or without the other photonic components, such as the laser source.

What is claimed is:

1. A method of making an integrated circuit, comprising:
   providing a substrate comprising a carrier substrate, a buried insulating layer, and a semiconductor layer above the buried insulating layer, the buried insulating layer being above the carrier substrate, the semiconductor layer having a first side and an opposite second side contacting the buried insulating layer;
   forming a grating coupler in the semiconductor layer;
   forming a first insulating layer over the first side of the semiconductor layer;
   forming a mirror in the first insulating layer, the mirror overlapping with the grating coupler;
   after forming the mirror, removing the carrier substrate and the buried insulating layer to expose the second side of the semiconductor layer; and
   after removing the carrier substrate and the buried insulating layer, forming a second insulating layer to cover the exposed second side of the semiconductor layer, wherein the integrated circuit comprising the grating coupler and the mirror forms part of a photonic integrated circuit.

2. The method according to claim 1, wherein the semiconductor layer comprises a silicon layer.

3. The method according to claim 1, further comprising forming a laser source in the second insulating layer.

4. The method according to claim 3, wherein forming the laser source comprises:
   forming a patterned semiconductor heterostructure over the second insulating layer; and
   depositing an encapsulant material surrounding the patterned semiconductor heterostructure.

5. The method according to claim 4, further comprising forming a first waveguide, directly under the laser source, in the semiconductor layer, the grating coupler being disposed proximate to the first waveguide.

6. The method according to claim 5, wherein forming the laser source further comprises, prior to forming of the patterned semiconductor heterostructure, forming a second waveguide in the second insulating layer, the second waveguide being formed directly over the first waveguide.

7. The method according to claim 6, wherein forming the second waveguide comprises:
depositing a third insulating layer contacting the first side of the semiconductor layer;
depositing an amorphous semiconductor layer over the third insulating layer;
etching the amorphous semiconductor layer to form a patterned amorphous semiconductor layer; and
depositing the second insulating layer above the third insulating layer.

8. The method according to claim 1, wherein the mirror is formed while forming metal lines in the first insulating layer.

9. The method according to claim 1, aligning the grating coupler with the mirror so that light via the semiconductor layer is divided in the grating coupler into a first beam that crosses the second insulating layer toward an optical fiber interface at an exposed surface of the second insulating layer and into a second beam toward the mirror and reflected toward the optical fiber interface.

10. The method according to claim 1, further comprising forming a modulator in the semiconductor layer, the modulator being proximate the grating coupler.

11. A method of operating an integrated circuit, the method comprising:
generating light from a laser source disposed within an encapsulating material, the encapsulating material having an first major surface and a second major surface;
directing the light towards a first waveguide disposed directly under the laser source, the first waveguide disposed in a semiconductor layer having a first side and an opposite second side, the first major surface facing towards the semiconductor layer and the second major surface facing away from the semiconductor layer; and
using a grating coupler in the semiconductor layer, splitting the light into a first beam directed towards an optical fiber interface at the second major surface of the encapsulating material and into a second beam towards a mirror disposed in an insulating layer comprising metallization, wherein the mirror is configured to reflect the second beam towards the optical fiber interface.

12. An integrated circuit comprising:
a semiconductor layer comprising a first side and a second side;
a first waveguide disposed in the semiconductor layer;
an encapsulating material disposed over the first side of the semiconductor layer;
a laser source disposed in the encapsulating material; and
an insulating layer disposed under the second side of the semiconductor layer, wherein the semiconductor layer is disposed between the encapsulating material and the insulating layer, wherein the integrated circuit comprises no other semiconductor substrate between the encapsulating material and the insulating layer, wherein the integrated circuit comprising the first waveguide and the laser source forms part of a photonic integrated circuit.

13. The integrated circuit of claim 12, wherein the laser source is disposed directly over the first waveguide.

14. The integrated circuit of claim 13, further comprising a second waveguide disposed between the first waveguide and the laser source.

15. The integrated circuit of claim 12, further comprising:
a grating coupler disposed in the semiconductor layer; and
a modulator in the semiconductor layer, the grating coupler disposed between the first waveguide and the modulator.

16. An integrated circuit comprising:
a semiconductor layer comprising a first side and a second side;
a grating coupler disposed in the semiconductor layer;
an encapsulating material disposed over the first side of the semiconductor layer;
an insulating layer disposed under the second side of the semiconductor layer, wherein the semiconductor layer is disposed between the encapsulating material and the insulating layer, wherein the integrated circuit comprises no other semiconductor substrate between the encapsulating material and the insulating layer; and
a mirror disposed in the insulating layer, the mirror overlapping with the grating coupler, wherein the integrated circuit comprising the grating coupler and the mirror forms part of a photonic integrated circuit.

17. The integrated circuit of claim 16, further comprising:
a first waveguide disposed in the semiconductor layer proximate the grating coupler; and
a laser source disposed in the encapsulating material.

18. The integrated circuit of claim 17, wherein the laser source is disposed directly over the first waveguide.

19. The integrated circuit of claim 17, further comprising a second waveguide disposed in the insulating layer, wherein the first waveguide is disposed between the second waveguide and the laser source.

20. The integrated circuit of claim 19, further comprising:
a modulator in the semiconductor layer, the grating coupler disposed between the first waveguide and the modulator.

* * * * *